US009728180B2

(12) United States Patent
Robertson

(10) Patent No.: US 9,728,180 B2
(45) Date of Patent: Aug. 8, 2017

(54) ACCOUSTIC WAVE REPRODUCTION SYSTEM

(71) Applicant: ETH ZURICH, Zurich (CH)

(72) Inventor: Johan Olof Anders Robertson, Wald (CH)

(73) Assignee: ETH Zurich, Zurich (DE)

( * ) Notice: Subject to any disclaimer, the term of this patent is extended or adjusted under 35 U.S.C. 154(b) by 162 days.

(21) Appl. No.: 14/389,455

(22) PCT Filed: Mar. 27, 2013

(86) PCT No.: PCT/CH2013/000054
§ 371 (c)(1),
(2) Date: Sep. 30, 2014

(87) PCT Pub. No.: WO2013/143016
PCT Pub. Date: Oct. 3, 2013

(65) Prior Publication Data

US 2015/0078563 A1 Mar. 19, 2015

(30) Foreign Application Priority Data

Mar. 30, 2012 (GB) .................................. 1205693.3
May 22, 2012 (GB) .................................. 1209118.7

(51) Int. Cl.
*H03G 3/00* (2006.01)
*G10K 15/08* (2006.01)
*G10K 11/178* (2006.01)

(52) U.S. Cl.
CPC .......... *G10K 15/08* (2013.01); *G10K 11/1786* (2013.01); *G10K 2210/3048* (2013.01);
(Continued)

(58) Field of Classification Search
CPC ............... G10K 15/08; G10K 11/1786; G10K 2210/3084; G10K 2210/3215; G10K 2210/3219
See application file for complete search history.

(56) References Cited

U.S. PATENT DOCUMENTS 6,111,962 A 8/2000 Akio
7,715,985 B2 5/2010 Van Manen et al.
(Continued)

FOREIGN PATENT DOCUMENTS

JP 2002-044794 A 2/2002
JP 2006-047523 A 2/2006

OTHER PUBLICATIONS

International Search Report for corresponding International Application No. PCT/CH2013/000054 dated Dec. 6, 2013.
(Continued)

*Primary Examiner* — Simon Sing
(74) *Attorney, Agent, or Firm* — Renner, Otto, Boisselle & Sklar, LLP

(57) ABSTRACT

A method of and a system for generating an acoustic wave representing reverberations from a desired acoustic environment are described including having a recording surface (11) defined by a spatial distribution of recording transducers (o) and an emitting surface defined by a spatial distribution of emitting transducers (x), wherein the emitting surface (12) defines a volume within which the recording surface (11) is located, recording an acoustic wave (14) originating from within a volume defined by the recording surface (11) using the recording transducers (x), extrapolating the recorded wave (14) to the emitting surface using wavefield propagator system (IS) representing the desired acoustic environment, and emitting the extrapolated wave from the emitting transducers (o).

21 Claims, 4 Drawing Sheets

(52) U.S. Cl.
CPC ................ *G10K 2210/3215* (2013.01); *G10K 2210/3219* (2013.01)

(56) References Cited

U.S. PATENT DOCUMENTS

| | | | | |
|---|---|---|---|---|
| 2001/0043714 | A1* | 11/2001 | Asada ...................... | H04R 5/02 381/399 |
| 2005/0047619 | A1* | 3/2005 | Murata ................... | H04S 7/305 381/309 |
| 2005/0175197 | A1 | 8/2005 | Melchior et al. | |
| 2006/0262939 | A1* | 11/2006 | Buchner ................. | H04S 5/005 381/56 |
| 2007/0025560 | A1 | 2/2007 | Asada | |
| 2008/0252481 | A1* | 10/2008 | Vacar ....................... | H04Q 9/00 340/870.38 |
| 2010/0246324 | A1* | 9/2010 | Dragoset, Jr. ............ | G01V 1/36 367/24 |
| 2011/0261973 | A1 | 10/2011 | Nelson et al. | |
| 2013/0083625 | A1* | 4/2013 | Ferber .................... | G01V 1/005 367/24 |

OTHER PUBLICATIONS

Berkhout et al., "Acoustic control by wave field synthesis", J. Acoust. Soc. Am. 93 (5), May 1993, pp. 2764-2778 (cited in Specification on p. 1).

Berkhout et al., "Array technology for acoustic wave field analysis in enclosures", J. Acoust. Soc. Am. 102 (5), Nov. 1997, pp. 2757-2770 (cited in Specification on p. 1).

Cassereau et al., "Focusing with plane time-reversal mirrors: An efficient alternative to closed cavities", J. Acoust. Soc. Am., 94 (4), Oct. 1993, pp. 2373-2386 (cited in Specification on p. 2).

Grote et al., "Nonreflecting boundary conditions for time-dependent multiple scattering", Journal of Computational Physics 221, 2007, pp. 41-62 (cited in Specification on p. 2).

Grote et al., "Local nonreflecting boundary condition for time-dependent multiple scattering", Journal of Computational Physics 230, 2011, pp. 3135-3154 (cited in Specification on p. 2).

Lim et al., "Experimental Validation of the Active Noise Control Methodology Based on Difference Potentials", AIAA Journal, vol. 47, No. 4, Apr. 2009, pp. 874-884 (cited in Specification on p. 2).

Van Manen et al., "Exact wave field simulation for finite-volume scattering problems", J. Acoust. Soc. Am. 122 (4), Oct. 2007, pp. EL115-EL121 (cited in Specification on p. 2).

Thomson, "Research Note: Internal/external seismic source wavefield separation and cancellation", Geophysical Prospecting, 60, 2012, pp. 581-587 (cited in Specification on p. 2).

Utyuzhnikov, "Non-stationary problem of active sound control in bounded domains", Journal of Computational and Applied Mathematics 234, 2010, pp. 1725-1731 (cited in Specification on p. 2).

J. E. Ffowcs Williams, "Anti-sound", Proceeding of the Royal Society of London A 395, 1984, pp. 63-88 (cited in Specification on p. 2).

Marius Forster, "Auralization in Room Acoustics", Bachelor's Thesis by Marius Forster, Graz University of Technology, Jul. 30, 2008, 60 pages.

Theile et al., "Wellenfeldsynthese Neue Moglichkeiten der raumlichen Tonaufnahme und-wiedergabe", Fernseh-Und Kino-Technik, vol. 57, No. 4, Apr. 1, 2003, pp. 735-739.

Osen et al., "Toward optimal spatial filters for demultiple and wavefield splitting of ocean-bottom seismic data", Geophysics, vol. 67, No. 6, Nov.-Dec. 2002, pp. 1983-1990.

Laase Amundsen, "Wavenumber-based filtering of marine point-source data", Geophysics, vol. 58, No. 9, Sep. 1993, pp. 1335-1348.

* cited by examiner

ACCOUSTIC WAVE REPRODUCTION SYSTEM

This application is a national phase of International Application No. PCT/CH2013/000054 filed Mar. 27, 2013 and published in the English language, which claims priority to Application No. GB 1205693.3 filed Mar. 30, 2012 and application No. GB 1209118.7 filed May 22, 2012.

FIELD OF THE INVENTION

The present invention relates to a system and a method of reproducing sound waves.

BACKGROUND OF THE INVENTION

It is known, particularly in certain areas of acoustics and seismics, to interpret pressure and particle velocity measurements as representative of Green's functions or equivalent functions representing the influence that the medium supporting the wave propagation has on a traveling wave or wavefield. Examples of the methods applied in this field can be found for example in:

A. J. Berkhout, D. de Vries, and P. Vogel, 1993, Acoustic control by wave field synthesis: J. Acoust. Soc. Am. 93 (5), 2764-2778;

A. J. Berkhout, D. de Vries, and J. J. Sonke, 1997, Array technology for acoustic wave field analysis in enclosures: J. Acoust. Soc. Am. 102 (5), 2757-2770;

Cassereau, D., and M. Fink, 1993, Focusing with plane time-reversal mirrors: An efficient alternative to closed cavities: J. Acoust. Soc. Am., 94, 2373-2386;

Grote, M., and C. Kirsch, 2007, Nonreflecting Boundary Conditions for Time Dependent Multiple Scattering, J. Comp. Physics, 221, 41-62;

Grote, M., and I. Sim, 2011, Local Nonreflecting Boundary Conditions for Time Dependent Multiple Scattering, J. Comp. Phys. 230, 3135-3154;

Lim, H., S. V. Utyuzhnikov, Y. W. Lam, A. Turan, M. R. Avis, V. S. Ryanebkii, and T. S. Tsynkov, 2009, Experimental validation of the active noise control methodology based on difference potentials: AIAA Journal, 47, 874-884;

van Manen, D. J., Robertsson, J. O. A., and Curtis, A., 2007, Exact wave field simulation for finite-volume scattering problems: J. Acoust. Soc. Am., 122, EL115-EL121;

van Manen, Robertsson, Curtis, 2010, Method of evaluating the interaction between a wavefield and a solid body, U.S. Pat. No. 7,715,985B2;

Thomson, C. J., 2012, Research Note: Internal/external seismic source wavefield separation and cancellation: Geophysical Prospecting, DOI: 10.1111/j.1365-2478.2011.01043.x;

Utyuzhnikov, S. V., 2010, Non-stationary problem of active sound control in bounded domains: J. Comp. Appl. Math., 234, 1725-1731; and Ffowcs Williams, J. E., 1984, Anti-sound: Proceeding of the Royal Society of London A, 395, 63-88.

van Manen et al. (2007, 2010) introduced so-called exact boundary conditions (EBC's). These allow for two wave propagation states in a numerical simulation to be coupled together. In particular van Manen et al. (2007) studied the problem of recomputing synthetic seismic data on a model after making local model alterations. EBC's enable to completely account for all long-range interactions while limiting the recomputation to a small model just around the region of change. van Manen et al. (2007) outlined the basic theory and demonstrated it on a ID example. Related concepts were recently proposed by Grote and Kirsch (2007), Grote and Sim (2011), Thomson (2012) and Utyuzhnikov (2010).

The concept of noise cancellation is widely known in the field of acoustic signal processing as described for example by Ffowcs Williams (1984) and Lim et al. (2009). In active noise cancellation a wave signal is recorded using an acoustic transducer (microphone), processed to generate a phase-inverted signal, and emitted by transducers (loudspeakers) to interfere destructively such that the listener no longer hears the original noise.

It is seen as an object of the invention to create a virtual sound environment for a listener such that the listener perceives to be located—at least acoustically—in an environment different from the actual one.

SUMMARY OF THE INVENTION

According to an aspect of the present invention, there is provided a method of and a system for generating an acoustic wave representing reverberations from a desired acoustic environment, said method including the steps of having a recording surface defined by a spatial distribution of recording transducers and an emitting surface defined by a spatial distribution of emitting transducers, wherein the emitting surface defines a volume within which the recording surface is located, recording an acoustic wave originating from within a volume defined by the recording surface using the recording transducers, extrapolating the recorded wave to the emitting surface using a wavefield propagator representing the desired acoustic environment and emitting the extrapolated wave from the emitting transducers.

Reverberations include acoustic wave signals caused by the reflection of an original wave at an acoustic obstacle. Examples of reverberations are echoes. Reverberations can be regarded as the acoustic signature of the environment the listener wishes to be located in. The direct sound of an acoustic event reaching the ear of a listener without reflection is treated as being identical in any environment.

The term "wavefield propagator" is used to denote any wave extrapolation method which includes a signature characteristic of the acoustic medium through which the wave emanating from an original event travels or is supposed to have traveled.

The propagators can be determined through measurements using known test wave signals or generated synthetically provided that sufficient information of the desired acoustic environment is known. Measured propagators can also be augmented by synthetical ones and vice versa.

The receiving surface is best designed to be at least as acoustically transparent as possible, such as using wire frame constructions. However regarding the emitting surface fewer limitations exists. If both are designed to be acoustically transparent, the surfaces are best surrounded by another sound-absorbing surface to further suppress unwanted reverberations of the original acoustic wave from the actual environment of the listener. In another embodiment, the emitting surface coincides with a surface of known acoustic properties such as the reflection coefficient. Such a surface can include pressure-release essentially perfectly reflecting surface, or an essentially perfectly rigid surface. In case the reflection coefficient R is known the emitted wavefield has to include a factor derived from R (using the known laws of reflection to match the amplitudes of the direct wavefield and reverberation to be suppressed.

A spatial distribution of transducers can includes a line of transducer as long as the line is not located in a single flat plane but follows at least partially the contours of the volume.

For most application it can be required to measure not only the amplitude but also directional properties of the wavefield at the recording surface. Hence, in a preferred embodiment of the invention the recording surface includes monopole and dipole transducers and/or at least two spatially separated layers of monopole transducers. Similar arrangements of transducers can be used on the emitting surface to give the emitted wavefield a desired directionality.

For a better cancellation of the direct wavefield it can be advantageous to use wavefield separation filters to the data recorded on the recording surface before extrapolating the filtered data to the emitting surface and/or to extrapolated data before emitting the filtered data along the emitting surface.

The position of a listener is typically within the volume or space as defined by the recording surface. In certain applications such as the shielding of a volume from probing acoustic signals such as sonar waves, the listener can also be envisaged being located outside the emitting surface. In the latter case the role of the emitting and recording surfaces is reversed.

These and further aspects of the invention will be apparent from the following detailed description and drawings as listed below.

BRIEF DESCRIPTION OF THE FIGURES

Exemplary embodiments of the invention will now be described, with reference to the accompanying drawing, in which.

DETAILED DESCRIPTION van Manen et al. (2007) showed that in computer simulations the elastodynamic representation theorem can be used to generate so-called exact boundary conditions connecting two states to each other. van Manen et al. (2007) noted that even though the Green's functions inside the boundary (state 1) might be completely different compared to the Green's functions in another greater model (state 2), the two states can be "stitched together" so that Green's functions outside the boundary correspond to state 2 whereas the Green's functions inside the boundary corresponds to state 1. van Manen et al. (2007) exploited this property to be able to regenerate Green's functions after local model alterations on a large computational model while only carrying out computations locally enabling substantial computational savings in computer simulations of wave propagation.

Herein, it is noted that the same equations can be used in a physical set-up to create a virtual acoustic world. Although the following description uses acoustic wave propagation (e.g., sound waves in water or air) as an example, the same methodology applies in principle to elastic waves in solids or electromagnetic wave propagation (e.g., light or microwaves).

Figure 1A:
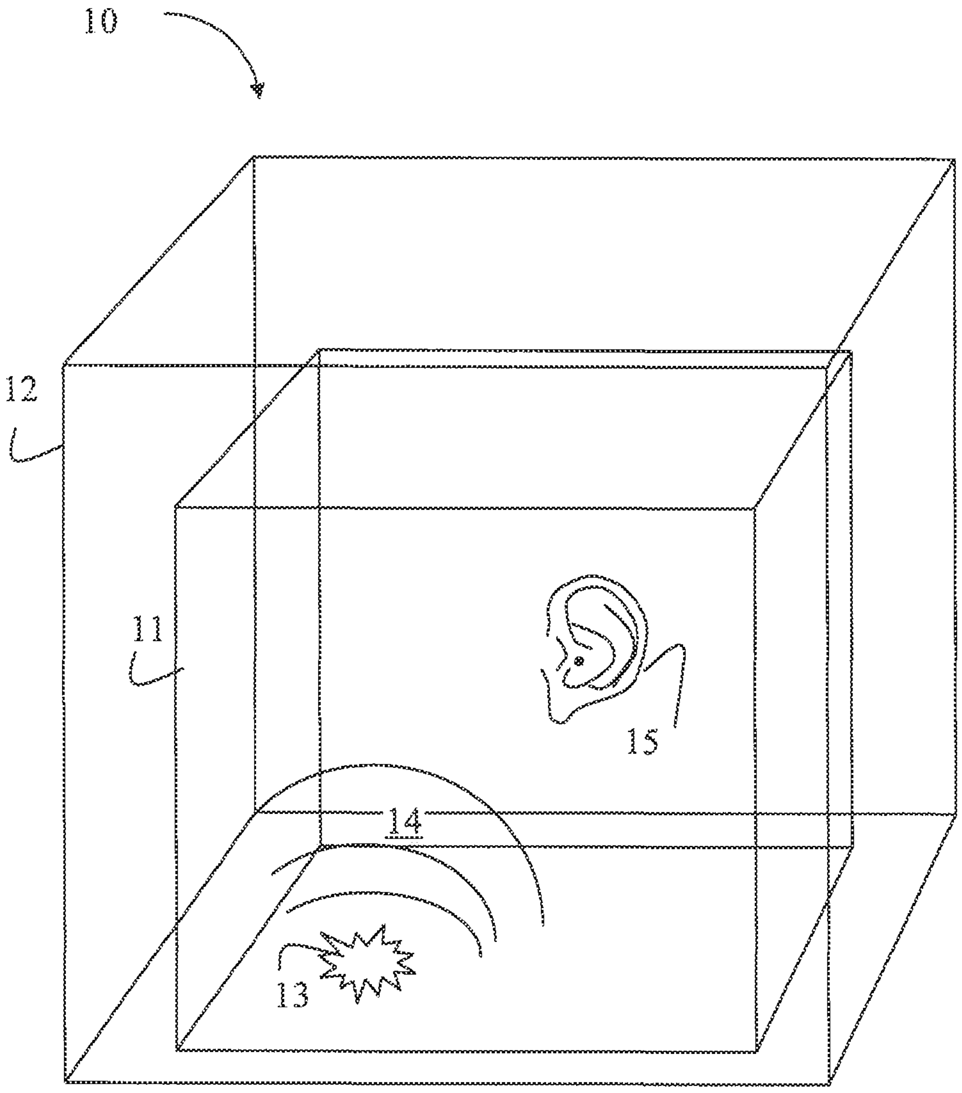
FIG. 1A shows a simplified three-dimensional example in accordance with the present invention.
Figure 1B:
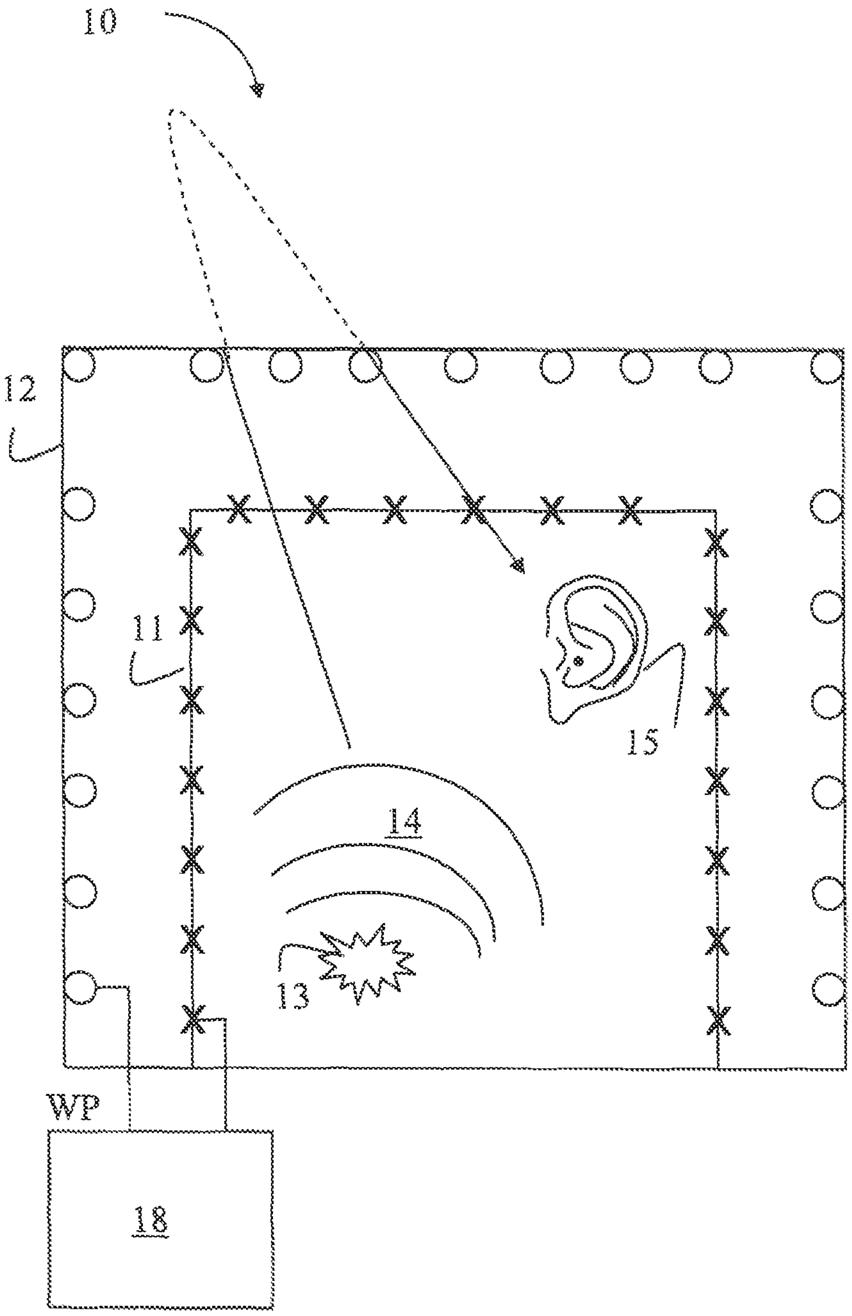
FIG. 1B shows a cross-section through the surfaces shown in FIG. 1A indicating actual and virtual wave propagation.

In the present example of the invention it is the aim to create a room where an arbitrary acoustic environment can be emulated (in the following referred to as the "sound cave" or the virtual state), as illustrated in FIGS. 1A and 1B. The figures show a possible implementation of the sound cave 10. The sound cave includes a first inner surface 11 in form of a cube. The inner surface is surrounded by an outer surface 12 also in a cubical shape. As shown in the vertical cross-section of FIG. 1B the surfaces carry receivers (x) and emitters (o). The floor is a shared surface between the two surfaces. A sound event 13 inside the receiving surface 11 creates a sound wave 14 which is registered by a listener 15.

Figure 2:
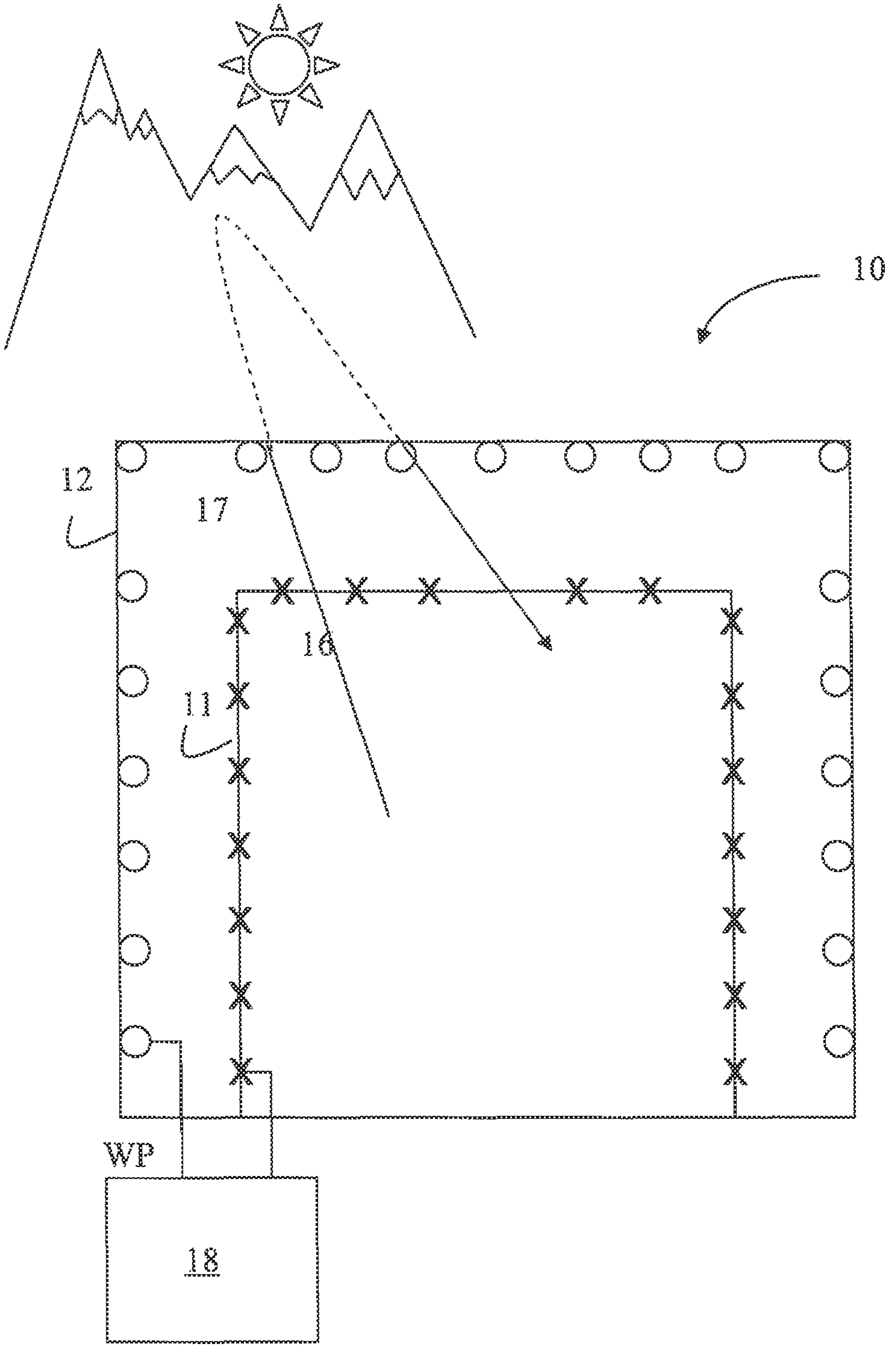
FIG. 2 illustrates a method of generating the wave propagator in accordance with an example of the invention.

The method described below includes a step of recording Green's functions WP as wave propagators in a desired acoustic environment (referred to as the desired state; e.g., an alpine meadow surrounded by mountains as indicated in FIG. 2., with other examples of a desired environment being an opera house such as La Scala theatre or a church building as St. Paul's Cathedral) with each environment requiring its own recording of the wave propagator or a synthetically generated wave propagator.

The Green's functions WP or any equivalent representation of the desired wave propagator are stored in a computer 18 (see FIG. 1B and FIG. 2). A person located in the sound cave will experience an acoustic space corresponding to the Green's functions from the desired state used to generate boundary conditions. The person will be able to interact with "virtual objects" only captured in the Green's functions. For example, if a mountain chain was present at some distance from the location where Green's functions were recorded (as in FIG. 2), any sound from within the sound cave, for example a person calling out, will generate echoes from the mountain chain just as if it was actually present.

Green's functions between all points on the emitting and recording surfaces where transducers are located in the sound cave are recorded as an initial step. Note that these Green's functions will not only contain the direct wave between the two points on the two different surfaces. Although the direct wave typically will be the most significant part of the Green's functions, it is the reverberations from the surrounding acoustic environment in the desired state that are the most interesting part in this example.

Green's functions between the two surfaces are recorded by physically mimicking the geometry of the two surfaces in the sound cave. By emitting a sound-pulse in one location on one of the surfaces and recording it at one or several points on the recording surface, it is possible to record all the required Green's functions that are required to characterize an acoustic environment such as a mountain chain or the La Scala theatre. This step can be performed by emitting from the recording surface 11 and recording from the emitting surface 12. If it is however more convenient to maintain the transducers in their actual role, the reciprocal of the desired wave propagators WP(−) can be recorded and reversed before use in the computer system 18.

Instead of physically recording Green's functions in a desired state, it is also possible to generate completely synthetic Green's functions corresponding to a model of a desired acoustic landscape. This may be of particular interest in gaming and entertainment applications. Since synthetic Green's functions may be a lot simpler in structure, it may be possible to reduce the computational requirements of the sound cave significantly.

The sound cave 10 can be described as a machine creating the virtual acoustic environment emulating the desired state in which the Green's functions were recorded. On the surface 12 at the edge of the wall (just inside), transducers (o) are evenly spaced typically according to the Nyquist sampling criterion. These transducers are used to emit sound (referred to as the emitting layer of transducers). In the preferred embodiments, only monopole transducers are used to emit sound. However, in some embodiments it is necessary to use both monopole and dipole transducers to achieve the desired directivity of the emitted sound in the directions out-going or in-going compared to the emitting surface.

Another surface 11 of transducers (x) is positioned a short distance inside the emitting surface. The transducers (x) record the sound in the sound cave and the layer 11 is referred to as the recording layer of transducers. It should be noted that both transducers that record pressure and particle velocities—equivalent to monopole and dipole receivers—are needed on the recording surface or alternatively two layers of pressure sensitive transducers so that the pressure gradient normal to the recording surface can be recorded.

The transducers may be mounted on thin rods that are practically acoustically transparent at the frequencies of interest. Again, the transducers on the recording surface are spaced typically according to the Nyquist sampling criterion. Note that one or several sides of the sound cave may be absent of transducers if its boundary conditions are the same in the desired and virtual states (e.g., a solid stone floor at the bottom or an open sky at the top). To reduce the number of transducers, it is possible to reduce the spread of transducers on the surfaces to a single line of transducers x,o (again best separated according to the Nyquist sampling criterion) on one or both of the surfaces 11,12.

As the person inside the sound cave calls out, the sound will be recorded on the recording surface. A computer is used to extrapolate the recorded wavefield from the recording surface to the emitting surface using a wavefield propagator (derived from Green's theorem or equivalent formulae known as Betti's theorem, Kirchhoff's scattering integral or acoustic representation theorem, etc.). Other examples of wavefield propagators can be found in Grote and Kirsch (2007), Grote and Sim (2011), Thomson (2012) and Utyuzhnikov (2010). Using for example the acoustic representation theorem the following expression for the emitted wavefield is obtained:

$$p^{emt}(x^{emt},T)=\int_0^T\int_{\partial D^{rec}}[G^{vir}(x^{emt}|x^{rec},T-\tau)v_k^{rec}(x^{rec},\tau)+\Gamma_k^{vir}(x^{emt}|x^{rec},T-\tau)p^{rec}(x^{rec},\tau)]n_k\,dA\,d\tau$$

where $p^{emt}(x^{emt},T)$ is the desired extrapolated pressure data at a location $x^{emt}$ and at time T, $\partial D^{rec}$ is the surface of a so-called recording surface (defined below) with normal vector component to the surface $n_k$, dA represents an infinitesimal surface area integration element of the recording surface and T is the time integration variable (coordinates on the recording surface are denoted $x^{rec}$). The variables $p^{rec}$ and $v_k^{rec}$ represent that data recorded by the transducers on the recording surface in terms of pressure and particle velocity (the later quantity can also be computed from either pressure gradient recordings or recordings of particle displacement, particle acceleration, etc.). The variables $G^{vir}$ and $\Gamma_k^{vir}$ are the pre-determined Green's functions between the recording and emitting surfaces of the desired (virtual) state in terms of pressure-to-pressure and particle-velocity-to-pressure. A similar equation to equation [1] can be used to extrapolate the wavefield in terms of particle velocities which is needed to emit the wavefield on dipole-types of receivers.

The extrapolated wavefield will constitute an out-going wavefield and an in-coming (reverberated) wavefield. It is preferred that the physically propagating wavefield is out-going only and that it does not reflect from the physical boundary of the sound cave.

In one embodiment, the emitting transducers are mounted on a so-called pressure-release (free) boundary. An out-going wave physically propagating in the sound cave will be absorbed as it reaches the boundary and reflects while undergoing a phase reversal (due to the −1 reflection coefficient of the boundary in terms of pressure) destructively interfering with the wavefield data for the out-going wave which is extrapolated and emitted as if the wave was out-going. Note that only emitting transducers of a monopole-type are needed in this embodiment.

In a variant of this embodiment the transducers are mounted on a rigid boundary where the reflection coefficient is −1 in terms of particle velocity and cancellation of the physically propagating wave can be achieved analogously to the embodiment for a pressure-release or free boundary. If a boundary is neither perfectly rigid nor perfectly free but where the reflection coefficient is known an appropriate transfer function can be applied to the extrapolated wavefield so that the direct wave from the emitting surface will destructively interfere with the direct propagating wavefield.

In another embodiment, the emitting transducers are located just inside a sound absorbing wall coinciding with the physical limit of the sound cave. The wavefield extrapolated from the recording surface to the emitting surface will contain both the (out-going) direct wave extrapolated to the emitting surface as well as both out-going and in-going reverberations as the direct wave interacts with the desired state. It is sufficient to think of waves originating from (primary or secondary) sources external or internal to the recording surface when analyzing how they will interfere with the physically propagating waves in the sound cave. The physically propagating direct wave between the recording surface and the emitting surface are best designed to destructively interfere with its extrapolated counter part. This can be achieved by reversing the phase of the part of the Green's function that corresponds to the direct wave only. However, whereas this method is sufficient for sources internal to the recording surface, it will have the opposite effect for sources external to the recording surface (Thomson, 2012).

However this undesired effect is only relevant for the wavefield that is out-going at the emitting surface. In the sound cave the problem of constructive interference between extrapolated and physically propagating out-going waves can be avoided for example by using the sound-absorbing layer outside the emitting surface. Advantageously the direct wave in the Green's function can be muted as it will be purely outgoing.

It is also possible to pre-record empirical Green's functions in the sound-cave and to isolate undesired parts that are due to reflections from imperfections of the nature of the walls or non-transparency of mounted transducers. These can then be removed from the extrapolated wavefield by subtracting isolated parts of the empirical Green's functions of the sound cave from the Green's functions of the desired state.

A sound-absorbing layer can also be employed to reduce the complexity of how the wavefield is introduced in the case where emitting transducers are not located on a rigid wall or pressure-release boundary. In contrast to the case where the emitting transducers are mounted directly on a wall and only monopole or dipole transducers are required, both dipole and monopole emitting transducers will be required in free space to ensure that out-going and in-going waves are emitted in the correct direction. However, before emitting the wavefield the out-going and in-going contributions can be computed. The in-going part, which is the only of interest, can be isolated and emitted from the emitting monopole transducers. Since no dipole emitting elements are present, it will radiate in both the in-going and out-going direction. However, the out-going contribution will directly reach the sound-absorbing layer.

The in-coming wavefield on the other hand is exactly the reverberation from the desired (or virtual) state of the person calling out. As shown in the figures as echo from a mountain chain, this wavefield will again propagate inwards to the person who will hear his/her own echo from the desired (or virtual) state.

The wavefield can be split into direct wavefield and/or in-coming or out-going wavefield using known methods such as described for example by:

Amundsen, L., 1993, Wavenumber-based filtering of marine point-source data. Geophysics, 58, 1335-1348; or by Osen, A., Amundsen L., and Reitan, A., 2002, Toward optimal spatial filters for demultiple and wavefield splitting of ocean-bottom seismic data: Geophysics, 67, 1983-1990.

Sounds for (virtual) sources exterior to the emitting surface can also be added to the extrapolated wavefield so that the sound cave projects sound sources external to the emitting boundary into the cave. This is simply a matter of using the Green's functions of the virtual/desired state to extrapolate an external source onto the transducers on the emitting surface. For example, the song from flying birds can be projected into the sound cave and can for example be added to the reverberations of any sounds emanating from within the sound cave. This external source will be in most cases based again on prerecorded signals and not actually present when a listener uses the sound cave.

The extrapolation process can be for example implemented by first noting that any operation on the wave includes the use of digitized signals discretized in time (as opposed to analogue signals). Therefore it is possible to be stepping forward in time by discrete time-steps when projecting a sound environment into the sound cave. The size of the time-step is related to the maximum frequency of interest in accordance to the Nyquist sampling theorem (in time).

The coupling of the sound cave with the virtual domain is achieved by using equation (4) in van Manen et al. (2007), which is a time-discrete version of Green's second identity:

$$\hat{p}^{emt}(\overline{x}^{emt}, l, m) = \hat{p}^{emt}(\overline{x}^{emt}, l, m-1) + \oint_{S^{rec}} \{\hat{G}(\overline{x}^{emt}, l-m; \overline{x}^{rec}, 0) \times \partial_j \hat{p}(\overline{x}^{rec}, m) - \partial_j \hat{G}(\overline{x}^{emt}, l-m; \overline{x}^{rec}, 0) \hat{p}(\overline{x}^{rec}, m)\} n_j dS(\overline{x}^{rec}) \quad [2]$$

where the caret denotes time sampled quantities, $\hat{p}(\overline{x}^{rec}, m)$ is the sampled pressure at time-step m and location $\overline{x}^{emt}$, $\hat{G}(\overline{x}^{emt}, l-m; \overline{x}^{rec}, 0)$ is the Green's function at time step l−m between $\overline{x}^{emt}$ and $\overline{x}^{emt}$, $\overline{x}^{rec}$ is a location on the integration surface $S^{rec}$ with normal $n_j$, and $\partial_j$ is a spatial gradient operator normal to the integration surface. Note that the usual time-integral in Green's second identity is implicit within the recursion in equation [2].

Green's functions for the numerical simulation connecting the recording and emitting surfaces $S^{rec}$ and $S^{emt}$ can be pre-computed using a wave propagation simulation technique. Acoustic waves are recorded along $S^{rec}$ at discrete time steps l. These data are extrapolated to $S^{emt}$ by means of equation [2] using the pre-computed Green's functions. The extrapolated data comprise a discrete time series that is added to a stored buffer $\hat{p}^{emt}(\overline{x}^{emt}, l, m)$ containing future values to be emitted along $S^{emt}$. At each time-step, equation [2] is thus evaluated as many times as the number of samples in the discrete Green's functions. At time-step l+1 data from the stored buffer are emitted on $S^{emt}$. In this way the acoustic environment within the recording surface can be linked with the desired virtual environment.

Referring again FIG. 2, the mountain chain outside the emitting surface 12 does not exist in the real acoustic environment of the listener but acoustic waves are virtually projected onto the mountain chain in accordance with our invention. The dashed curved arrow from the recording surface 11 to the mountain chain and back to the emitting surface indicate the (virtual) acoustic path of the wave 14 from the event 13 would have taken place if the mountain chain were present and if the confinements of any room in which the recording and emitting surface are placed during reproduction would not exist.

The extrapolation method presented here operates on the out-going wave recorded on the recording surface 11. In the embodiment where emitting transducers are mounted on a pressure-release or rigid wall, the extrapolated-outgoing wavefield will naturally absorb the physically propagating direct wave from the recording surface to the emitting surface. In the embodiment where a sound-absorbing layer is used outside the emitting surface, both the physically propagating as well as the extrapolated direct out-going wave is attenuated in the sound-absorbing layer.

The in-coming arrow represents the echo from the mountain chain and will propagate back inside the sound cave so that the listener can hear it. Note that another beneficial feature of equation [1] is that acoustic energy coming from the exterior of the recording surface will not be extrapolated back in the outward direction.

It is worth noting that the sound cave is completely general in terms of the numbers of sources or listeners inside the sound cave and will account for the complete interaction with all sources and listeners with each other and the desired acoustic environment.

Figure 3:
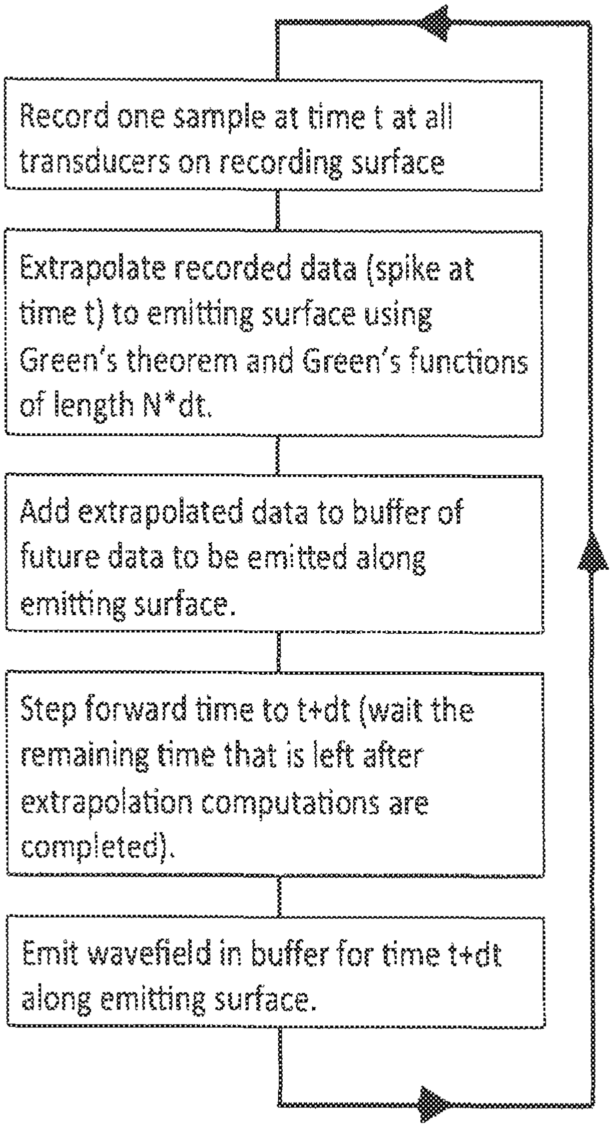
FIG. 3 is a flow chart with steps in accordance with an example of the invention.

To further illustrate the present example and how the extrapolation integral in equation [1] is solved and implemented at every discrete time-step through the following sequence of steps (the steps are also described in the flowchart in FIG. 3.

(1) The acoustic wavefield at time t (think of this as a spike with amplitude of the acoustic wavefield at the time but 0 at all other times) is recorded at the recording surface 11 and extrapolated using equation [1] to the emitting surface for all future time steps t+dt, t+2dt, t+3dt, . . . , t+Ndt, where Ndt is the length of the Green's function (maximum time that is allowed for reverberations to return).

(2) The record of all future values at the emitting surface 12 of the extrapolated wavefields from recording surface 11 are updated by adding the extrapolated wavefield from step (1).

(3) Then a step forward to time t+dt is taken and the next future prediction is used to emit sound at the emitting surface 12

(4) The process repeats starting from step (1)

Considering an example where the sound cave is a cubic room with length, depth and width of 2 m, the distance between the emitting and the recording layers is 25 cm and the "cube" defined by the recording layer 11 therefore has a width of 1.50 m. Assuming further that the floor is a solid stone floor in both the virtual and desired states, no transducers are needed on that surface in the sound cave. The emitting layer 12 has dimensions 2 m by 2 m by 2 m (emitting transducers (o) on 5 sides) whereas the recording layer has dimensions 1.5 m by 1.5 m by 1.75 m (recording transducers (x) on 5 sides).

Being interested in emulating frequencies up to for example 1 kHz, a temporal (Nyquist) sampling rate of 0.5 ms is required. The speed of sound is 340 m/s and the shortest wavelength is therefore 0.34 m. The required spatial (Nyquist) sampling rate is therefore 0.17 m. A number of transducer elements (o) on the emitting surface 12 is: 5*(1+round(2/0.17))*(1+round(2/0.17))=845. Similarly, the number of transducer elements (x) on the recording surface is 544. The Green's functions are going to be 5000 samples long (2.5 s). This would allow echoes from objects up to 425 m away to be captured. Longer reverberation times and multiple echoes would require longer Green's functions.

The computations for the extrapolation needs to be done real-time bounded by the propagation distance between the recording and emitting surface (note that the distance between recording and emitting surfaces needs to be greater than the distance that sound propagates during the temporal sampling time interval). The number of calculations required each time step is: (number of transducers on emitting surface)*(number of transducers on recording surface)*(number of samples in Green's function)*(number of operations in integrand for extrapolation). In the present example the number of calculations are: 845*544*5000*3–6.9*10^9. With a sampling interval of 0.5 ms computations are generated at a computational rate of at least 14Tflop to create the correctly propagated wave at the correct time. The distance between the recording and emitting surfaces 11, 12 must be greater than the propagation velocity times the temporal sampling frequency in order to be able to predict the wavefield at the emitting surface from recordings at recording surface 11.

Remote compute servers or internet switches typically introduce computational latencies that lead to accumulative delays that are greater than the sampling interval. Light in vacuum propagates 150 km in the sampling rate of 0.5 ms which introduces an upper bound for how far away the computational facility can be located from the sound cave. Clearly, the computing engine 18 should preferably be co-located with the sound cave 10.

It is preferred for the medium between the recording and transmitting surface to have the same propagation characteristics as the same part of the medium where the Green's functions were recorded in the desired state. Usually this medium will be air.

Instead of recording and transmitting transducers, laser devices can be used to record and emit sound waves at desired locations. Another alternative is to use hypersonic sound (hss), also known more generally as "sound from ultrasound", where a beam of ultrasound is projected on a wall for example and sound is generated non-linearly on the wall and this starts radiating.

Applications for a sound cave embodiment can include:

- Entertainment industry such as computer games (gaming) or virtual reality experiences: A particular example of a gaming application could include a large room where several people are present at once for a virtual reality, interactive movie or gaming experience. Note that if the floor is reflecting and if the ceiling is coated with an absorbing material, virtual states that share these features (e.g., open sky and stone floor) can be generated with a sound cave where only the walls on the sides are covered with emitting and receiving elements. If the height of the room remains small (say 2 m), the dimensions of the room in the horizontal directions can be made quite large without the surface area covered by the recording and transmitting elements becoming excessively large;
- Video conferencing. The present invention can complement a video conference (using for example an holographic video reproduction) with an immersed acoustic experience
- Acoustic design or optimization. For example, a music band preparing a concert tour could optimize where to position loudspeakers in order for the acoustic experience to be optimal at different select positions at a venue. Green's functions would be physically recorded at different locations in the concert venue. The sound cave could then be used to simulate what the sound experience would be for a person located at that position.
- Acoustic environments can also be projected into a recording studio for film or music productions.
- Training of blind people by immersing them in the acoustic environment that they will be walking through, without risk of accidents or being run over by cars.
- By switching emitting and recording surfaces so that the recording surface is the outer surface, it is possible to create an "acoustic invisibility cloak". By using Green's functions of an empty space for the interior of the emitting surface, objects located inside will not be detectable by acoustic waves (e.g., sonar).
- By muting all or most of the outgoing waves and incoming reverberation the system can simulate an anechoic chamber.

As the present invention has been described above purely by way of example, and the above modifications or others can be made within the scope of the invention. The invention may also comprise any individual features described or implicit herein or shown or implicit in the drawings or any combination of any such features or any generalisation of any such features or combination, which extends to equivalents thereof. Thus, the breadth and scope of the present invention should not be limited by any of the above-described exemplary embodiments. Alternative features serving the same, equivalent or similar purposes may replace each feature disclosed in the specification, including the drawings, unless expressly stated otherwise, for example using the principles as described above to elastic waves propagating in solids or electromagnetic waves (e.g., light or microwaves). Unless explicitly stated herein, any discussion of the prior art throughout the specification is not an admission that such prior art is widely known or forms part of the common general knowledge in the field.

The invention claimed is:

1. A method of generating an acoustic wave representing reverberations from a desired virtual acoustic environment, said method including the steps of having a recording surface defined by a spatial distribution of recording transducers and an emitting surface defined by a spatial distribution of emitting transducers, wherein the emitting surface defines a volume within which the recording surface is located, recording an acoustic wave originating from within a volume defined by the recording surface using the recording transducers, extrapolating the recorded wave to the emitting surface using a wavefield propagator representing the desired virtual acoustic environment and emitting the extrapolated wave from the emitting transducers.

2. The method of claim 1 wherein the wavefield propagator is derived from prior recordings including the step of placing the recording and emitting surfaces into the desired virtual acoustic environment or generated synthetically or through a combination of prior recordings or synthetically generated propagators.

3. The method of claim 1 wherein the wavefield propagator is derived from prior recordings including the step of placing the recording and emitting surfaces into the desired virtual acoustic environment and activating the recording transducers or transducers replacing the recording transducers for the purpose of deriving the wavefield propagator to emit acoustic test signals and recording the test signals using the emitting transducers or transducers replacing the emitting transducers for the purpose of deriving the wavefield propagator.

4. The method of claim 1 wherein the wavefield propagator is derived as reciprocal wavefield propagator from prior recordings including the step of placing the recording and emitting surfaces into the desired virtual acoustic environment and activating the emitting transducers to emit acoustic test signals and record the test signals using the recording transducers.

5. The method of claim 1 wherein a listener's position is located within the emitting surface.

6. The method of claim 1 wherein the time to extrapolate a sample of the recorded wave is smaller than the sampling rate of the recording and/or emitted wave.

7. The method of claim 1 wherein a sample of the recorded wave recorded at a system time step I is extrapolated to the following system time step I+1 and beyond.

8. The method of claim 1 including the step of muting a direct wave contribution in the extrapolated wavefield.

9. The method of claim 8 including the step of reversing the polarity of the direct wave contribution.

10. The method of claim 1 including the step of using empirical Green's functions of the volume within the recording surface to remove undesired reflections from the listener's acoustic environment in the extrapolated wave.

11. The method of claim 1 including the step of mounting the emitting transducers on a wall with known the reflection coefficient and applying the reflection coefficient to manipulate the extrapolated wave such that a propagating direct wave destructively interferes with the extrapolated wave.

12. The method of claim 1 including the step of applying wavefield separation filters to data recorded on the recording surface before extrapolating the filtered data to the emitting surface and/or to extrapolated data before emitting the filtered data from the emitting surface.

13. The method of claim 1 including the step of inverting the role of the emitting and recording surfaces to generate a desired response from within the volume defined by the emitting surface to a listener outside the recording surface.

14. The method of claim 1 including the step of adding the extrapolated sound from a source external to the emitting surface to the emitted extrapolated wave.

15. A system of generating an acoustic wave representing reverberations from a desired virtual acoustic environment, said system including a recording surface defined by a spatial distribution of recording transducers and an emitting surface defined by a spatial distribution of emitting transducers, wherein the emitting surface defines a volume within which the recording surface is located, and signal processing equipment for recording an acoustic wave originating from within a volume defined by the recording surface using the recording transducers, extrapolating the recorded wave to the emitting surface using a wavefield propagator representing the desired virtual acoustic environment and emitting the extrapolated wave from the emitting transducers.

16. The system of claim 15, wherein the emitting surface is at least partially surrounded by a surface with known acoustic parameters with said parameters used to configure the wavefield propagator such that the propagating direct wave destructively interferes with the extrapolated wave.

17. The system of claim 15, wherein the emitting surface is at least partially surrounded by a sound absorbing material to absorb sound propagating to the outside or from the outside of the emitting surface or wherein the emitting surface is partly or fully surrounded by a surface with known reflection coefficients.

18. The system of claim 15 wherein the recording transducers include pressure and particle motion sensitive transducers.

19. The system of claim 15 wherein the recording transducers include two or more spatially separated layers of pressure sensitive transducers to record directional information of the wave.

20. The system of claim 15 wherein the emitting transducers include monopole, dipole transducers, or two spatially separated layers of monopole transducers or any combination thereof to generate a wave with directionality.

21. The system of claim 15 wherein the spatial distribution of transducers is a single line following a contour of the recording and/or emitting surface.

* * * * *